United States Patent
Hsieh et al.

(10) Patent No.: US 7,585,778 B2
(45) Date of Patent: Sep. 8, 2009

(54) METHOD OF ETCHING AN ORGANIC LOW-K DIELECTRIC MATERIAL

(75) Inventors: Chang-Lin Hsieh, San Jose, CA (US); Binxi Gu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/691,930

(22) Filed: Mar. 27, 2007

(65) Prior Publication Data
US 2008/0237183 A1 Oct. 2, 2008

(51) Int. Cl.
*H01L 21/302* (2006.01)

(52) U.S. Cl. ............... 438/711; 438/706; 438/725; 438/700

(58) Field of Classification Search ......... 438/700–716, 438/9, 725; 216/37, 67
See application file for complete search history.

(56) References Cited

U.S. PATENT DOCUMENTS

| | | | |
|---|---|---|---|
| 4,764,245 A | * | 8/1988 | Grewal ............... 438/700 |
| 6,265,320 B1 | | 7/2001 | Shi et al. |
| 6,331,380 B1 | * | 12/2001 | Ye et al. ............... 430/318 |
| 6,743,732 B1 | | 6/2004 | Lin et al. |
| 2004/0224520 A1 | * | 11/2004 | Yun et al. ............... 438/691 |

* cited by examiner

*Primary Examiner*—Dung A. Le
(74) *Attorney, Agent, or Firm*—Moser IP Law Group

(57) ABSTRACT

A method of etching organic low-k dielectric materials is provided herein. In one embodiment, a method of etching organic low-k dielectric materials includes placing a substrate comprising an exposed organic low-k dielectric material in an etch reactor; supplying a process gas comprising an oxygen-containing gas, a nitrogen-containing gas, and methane ($CH_4$); and forming a plasma from the process gas to etch the organic low-k dielectric material. The organic low-k dielectric material may include polymer-based low-k dielectric materials, photoresists, or organic polymers. The oxygen-containing gas may be oxygen ($O_2$) and the nitrogen-containing gas may be nitrogen ($N_2$).

19 Claims, 3 Drawing Sheets

METHOD OF ETCHING AN ORGANIC LOW-K DIELECTRIC MATERIAL

BACKGROUND OF THE INVENTION

1. Field of the Invention

Embodiments of the present invention generally relate to etch processes, and more specifically, to controlling an etch profile of an organic material.

2. Description of the Related Art

In the field of semiconductor device fabrication, as device feature sizes decrease to 0.18 µm and smaller, RC delay of interconnects becomes a major limiting factor for device speed. Two areas of development focus on this problem. First, the interconnect conductor resistance is being reduced by the use of copper and other conductors having a lower resistance than aluminum, which has been the industry standard for conductive interconnect material. In the second area, the interconnect contribution to the capacitance is being reduced by the use of dielectric materials having a lower dielectric constant (k) than silicon dioxide, which has been the industry standard dielectric.

Unfortunately, such lower dielectric constant (or low-k) materials are not easy to process using conventional fabrication techniques. For example, when etching low-k materials, it can be very difficult to satisfactorily control the etch profile of features being formed in the low-k materials. Other difficulties in etching low-k materials include undesirable microloading, micro-trenching, critical dimensions (CD) and poor sidewall profile.

Thus, there is a need for an improved method for etching organic materials.

SUMMARY OF THE INVENTION

A method of etching organic low-k dielectric materials is provided herein. In one embodiment, a method of etching organic low-k dielectric materials includes placing a substrate comprising an exposed organic low-k dielectric material in an etch reactor; supplying a process gas comprising an oxygen-containing gas, a nitrogen-containing gas, and methane ($CH_4$); and forming a plasma from the process gas to etch the organic low-k dielectric material. The organic low-k dielectric material may include SiLK, FLare, photoresists, or any organic polymers. The oxygen-containing gas may be $O_2$ and the nitrogen-containing gas may be $N_2$.

In some embodiments, a method of etching organic low-k dielectric materials includes placing a substrate comprising an exposed organic low-k dielectric material in an etch reactor; forming a plasma from a process gas comprising an oxygen-containing gas and a nitrogen-containing gas to etch the organic low-k dielectric material for a first period of time; and forming a plasma from a process gas comprising an oxygen-containing gas, a nitrogen-containing gas, and methane ($CH_4$) to etch the organic low-k dielectric material for a second period of time.

In some embodiments, an organic low-k dielectric etching compound includes about 10-30 percent methane ($CH_4$), about 50-80 percent $N_2$, and about 5-30 percent $O_2$.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention provide methods for etching organic materials. Generally, embodiments of the present invention provide a method for plasma etching organic materials with a process gas mixture that includes an oxygen-containing gas, and nitrogen-containing gas, and methane ($CH_4$).

Figure 1:
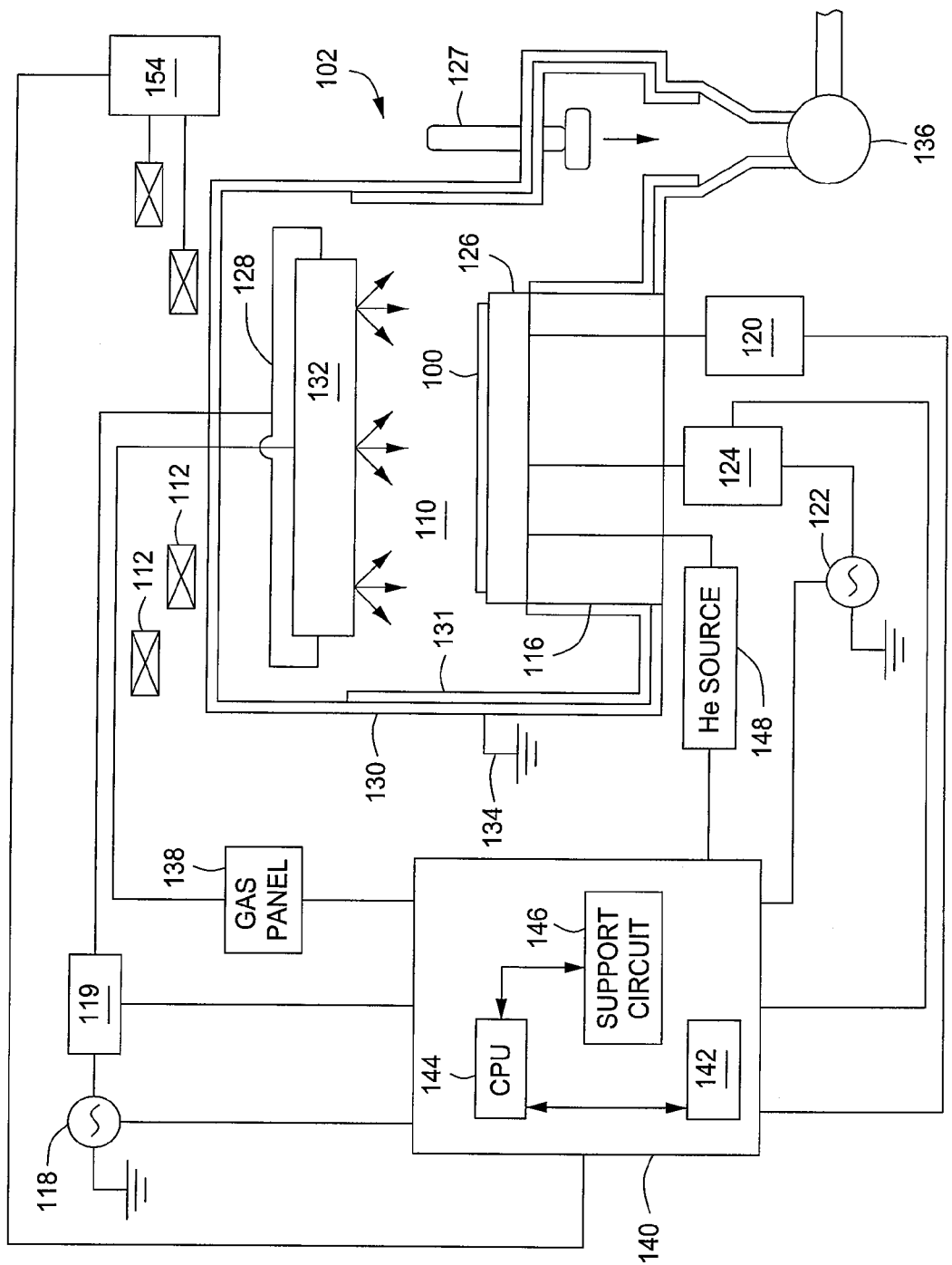
FIG. 1 depicts an etch reactor suitable for performing etch processes according to some embodiments of the present invention.

FIG. 1 depicts a schematic, cross-sectional diagram of a dual frequency capacitive plasma source etch reactor 102 suitable for use in performing methods of the present invention. This reactor is described in depth in commonly owned U.S. Pat. No. 6,853,141, issued Feb. 8, 2005 to Hoffman, et al., which is herein incorporated by reference in its entirety. One such etch reactor suitable for performing the invention is the ENABLER® processing chamber, available from Applied Materials, Inc., of Santa Clara, Calif. It is contemplated that the inventive methods may be performed in other process chambers generally suitable for etching materials.

As shown in FIG. 1, a reactor 102 includes a process chamber 110 having a conductive chamber wall 130. The chamber wall 130 is connected to an electrical ground 134 and comprises a ceramic liner 131. The ceramic liner 131 facilitates in situ self-cleaning capabilities of the chamber 110, so that byproducts and residues deposited on the ceramic liner 131 can be readily removed from the liner 131 after each substrate has been processed. The process chamber 110 also includes a support pedestal 116 and an upper electrode 128 spaced apart from and opposed to the support pedestal 116. The support pedestal 116 includes an electrostatic chuck 126 for retaining a substrate 100. The electrostatic chuck 126 is controlled by a DC power supply 120. A showerhead 132 is mounted to the upper electrode 128 and is coupled to a gas panel 138 for controlling introduction of various gases into the chamber 110. The showerhead 132 may include different zones such that various gases can be released into the chamber 110 with different volumetric flow rates.

The support pedestal 116 is coupled to a radio frequency (RF) bias power source 122 through a matching network 124. The bias power source 122 is generally capable of producing an RF signal having a tunable frequency of from about 50 kHz to about 53.56 MHz and a bias power of about 0 to 5,000 Watts. Optionally, the bias power source 122 may be a DC or pulsed DC source. The upper electrode 128 is coupled to an RF source power 118 through an impedance transformer 119 (e.g., a quarter wavelength matching stub). The RF source power 118 is generally capable of producing an RF signal having a tunable frequency of about 160 MHz and a source power of about 0 to 5,000 Watts. The chamber 110 is a high vacuum vessel that is coupled through a throttle valve 127 to a vacuum pump 136.

The reactor 102 may also include one or more coil segments or magnets 112 positioned exterior to the chamber wall 130, near a chamber lid 113. The coil segment(s) 112 are controlled by a DC power source or a low-frequency AC power source 154.

During processing of the substrate 100, gas pressure within the interior of the chamber 110 is controlled using the gas panel 138 and the throttle valve 127, and maintained in a range of about 0.1 to 999 mTorr. The temperature of the chamber wall 130 is controlled using liquid-containing conduits (not shown) located in and/or around the wall. The temperature of the substrate 100 is controlled by regulating the temperature of the support pedestal 116 via a cooling plate (not shown) having channels formed therein for flowing a coolant. In addition, a backside gas, such as a helium (He) gas from a Helium source 148, is provided into channels disposed between the back side of the substrate 100 and grooves (not shown) formed in the surface of the electrostatic chuck 126. The electrostatic chuck 126 may also include a resistive heater (not shown) within the chuck body to heat the chuck 126 to a steady-state temperature during processing. The backside He gas is used to facilitate uniform heating of the substrate 100. The substrate 100 can be maintained at a temperature of between about 10 to about 500 degrees Celsius.

A controller 140 including a central processing unit (CPU) 144, a memory 142, and support circuits 146 for the CPU 144 is coupled to the various components of the reactor 102 to facilitate control of the processes of the present invention. The memory 142 can be any computer-readable medium, such as random access memory (RAM), read only memory (ROM), floppy disk, hard disk, or any other form of digital storage, local or remote to the reactor 102 or CPU 144. The support circuits 136 are coupled to the CPU 144 for supporting the CPU in a conventional manner. These circuits include cache, power supplies, clock circuits, input/output circuitry and subsystems, and the like. A software routine or a series of program instructions may be stored in the memory 142 which, when executed by the CPU 144, causes the reactor 102 to perform processes of the present invention.

FIG. 1 only shows one exemplary configuration of various types of plasma reactors that can be used to practice the invention. For example, different numbers and types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma may be maintained solely by the bias power. The plasma density may be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, and the plasma subsequently guided toward the substrate using techniques known in the art.

Figure 2A:
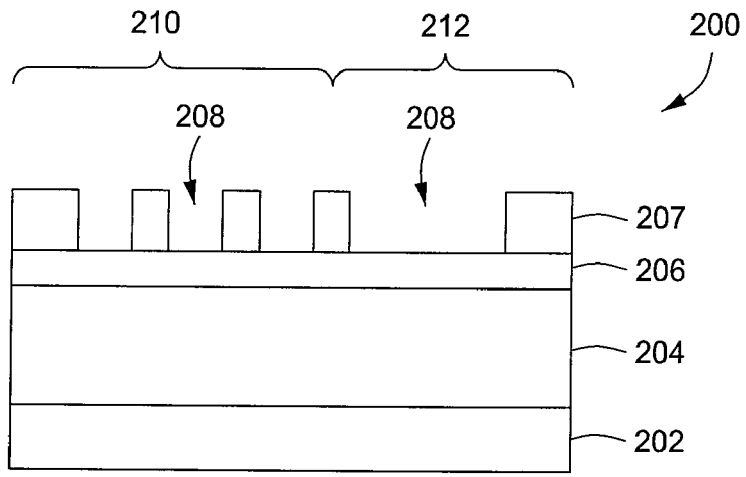
FIGS. 2A-B depict schematic diagrams of a substrate and a resulting etch in accordance with some embodiments of the present invention.
Figure 2B:
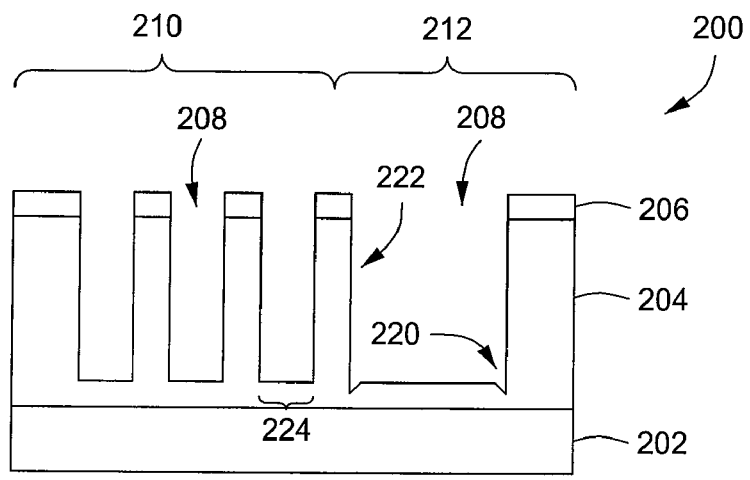
Figure 3:
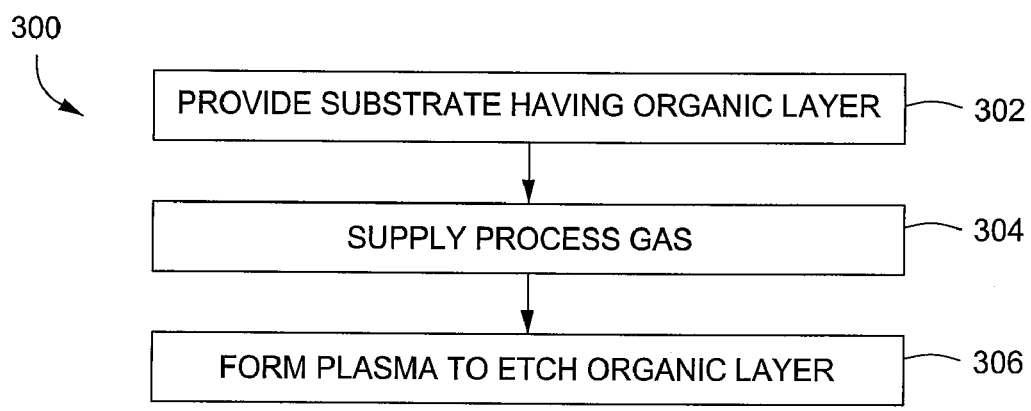
FIG. 3 depicts a flow diagram of a process for etching an organic, low-k dielectric material according to some embodiments of the present invention.

FIGS. 2A-B depict illustrative schematic representations of a substrate 200 having features etched into an organic layer in accordance with embodiments of the present invention. FIG. 3 depicts a flowchart of one embodiment of a method 300 for etching an organic material and is described with reference FIGS. 2A-B and the process chamber described above with respect to FIG. 1.

The method 300 begins at step 302 where a substrate 200 having an organic low-k dielectric layer 204 to be etched is provided into an etch reactor 102 (see FIGS. 1 and 2A). The substrate 200 may comprise any substrate having one or more material layers formed thereon, such as a semiconductor layer 202, an organic low-k dielectric layer 204, a hard mask, or cap layer 206, or the like. A resist layer 207 may be formed atop the cap layer 206 and patterned to define features that are to be etched into at least the organic low-k dielectric layer 204.

For example, the substrate 200 may be a 200 or 300 mm silicon wafer suitable for forming various devices, integrated circuits, or the like, thereon. It is contemplated that the present invention is useful for etching organic low-k dielectric materials disposed on other, non-semiconductive substrates as well, such as glass or sapphire substrates, or the like.

The organic low-k dielectric layer 204 may be any organic, low-k dielectric material having a dielectric constant that is less than the dielectric constant of silicon dioxide ($SiO_2$), which is about 3.9. For example, the organic material may be a polymer-based low-k dielectric material (such as SiLK®, available from Dow Chemical Company), an organic polymer (such as FLARE™, a bridged poly-arylene ether available from Honeywell Advanced Microelectronic Materials), or the like. The organic, low-k dielectric materials may be any layer or layers of a substrate, such as a bottom anti-reflective coating (BARC), a photoresist layer, part of a tri-layer resist, or the like.

The cap layer 206 may be formed atop the organic low-k dielectric layer 204. The cap layer 206 may be a spin-on oxide layer, a CVD oxide layer, or the like, and may comprise silicon oxide ($SiO_2$), silicon nitride (SiN), silicon oxynitride (SiON), or the like. The patterned resist layer 207 may be any suitable resist layer, such as a photosensitive resist or the like, and may be formed atop the cap layer 206. The patterned resist layer 207 is typically deposited and patterned to define one or more features 208 that are to be etched into the organic low-k dielectric layer 204. In some embodiments, the features 208 may be distributed to form regions 210 having a high feature density and regions 212 having a low feature density. The embodiment depicted in FIGS. 2A-B is illustrative only and is not to be considered limiting of the invention. It is contemplated that other substrates having the same or different material layers in various combinations may be provided in addition to the organic low-k dielectric layer to be etched.

Next, at step 304, a process gas is supplied to the etch reactor. The process gas typically comprises an oxygen-containing gas, a nitrogen-containing gas, and methane ($CH_4$). The oxygen-containing gas may comprise oxygen ($O_2$). The nitrogen-containing gas may comprise nitrogen ($N_2$). In one embodiment the process gas comprises $O_2$, $N_2$, and $CH_4$. In some embodiments, the process gas consists essentially of an oxygen-containing gas, a nitrogen-containing gas, and methane ($CH_4$). The process gas may further comprise a carrier or dilutant gas, such as argon (Ar) or carbon monoxide (CO).

The process gas may be supplied to the etch reactor at a total gas flow of from about 100-1000 sccm. In some embodiments, the total gas flow is from about 100-1000 sccm, and in one embodiment the total gas flow is about 550 sccm. The process gas may utilize a range of compositions. In one embodiment, the process gas may comprise between about 9-20 percent of the oxygen-containing gas (i.e., an oxygen-containing gas flow of between about 20-100 sccm). In one embodiment, the process gas may comprise between about 50-80 percent of the nitrogen-containing gas (i.e., a nitrogen-containing gas flow of between about 50-400 sccm). In one embodiment, the process gas may comprise between about 10-30 percent $CH_4$ (i.e., a $CH_4$ gas flow of between about 50-200 sccm). In one specific embodiment, $CH_4$ is provided at a rate of about 100 sccm; $N_2$ is provided at a rate of about 400 sccm; and $O_2$ is provided at a rate of about 50 sccm.

Next, at step 306, a plasma is formed from the process gas to etch the organic layer 204. In one embodiment, the plasma is a high density plasma, e.g., having a density greater than or equal to about $5 \times 10^{10}$ ions/cm$^3$. The plasma may be formed by coupling RF power to the process gas to dissociate and ionize the process gas. Generally, between about 200-1600 Watts of RF power may be provided at a frequency of between about 1-30 Mhz. In one embodiment about 800 Watts of RF power is supplied at a frequency of about 13.56 Mhz.

The temperature and pressure of the etch reactor 102 are regulated during processing to maintain an environment suitable for etching the organic layer 204. The temperature may be controlled in a range of between about 0-60 degrees Celsius. In one embodiment, the temperature is maintained at about 20 degrees Celsius. The pressure may be maintained in range of between about 5-500 mTorr. In one embodiment, the pressure is maintained at about 20 mTorr.

The plasma may be maintained until the etch process is complete (for example, as determined by time, optical endpoint detection techniques, monitoring of the plasma effluent, or the like), at which time the method ends and the substrate 200 may be further processed as desired.

Optionally, steps 304 and 306 may be part of a multi-step process wherein the organic low-k dielectric material 204 may be etched for a first period of time using just the oxygen and nitrogen containing gases and wherein the methane gas may be subsequently added to the plasma to continue etching the organic low-k dielectric material 204 for a second period of time. Alternatively, the organic low-k dielectric material 204 may be etched for a first period of time as described above and subsequently etched for a second period of time using just the oxygen and nitrogen containing gases. The process gas flows and process conditions for the first step may be similar to that described above with respect to steps 304 and 306 without the methane.

For example, as depicted in FIG. 2B, the features 208 are etched into the cap layer 206 and the organic layer 204 through the patterned resist layer 207, which may be partially or completely consumed in the etch process during step 306 (shown completely consumed in FIG. 2B). In some embodiments, the features 208 may be distributed to form regions 210 having a high feature density and regions 212 having a low feature density. Different regions may also or alternatively have features having different aspect ratios, underlying layers, or the like. It has been discovered that the method 300 of the present invention advantageously provides for improved verticality, or profile, of sidewalls 222 of the features being etched, improved critical dimensions 224, as well as providing reduced microtrenching 220 as compared to prior art etch methods. In addition, the method 300 has been discovered to further advantageously provide for forward, or positive microloading (e.g., the etch rate in open areas (e.g., regions 212 having low feature density) is faster than in areas having dense feature formation (e.g., regions 210 having high feature density)). It has further been found that the method 300 provides the above advantages while maintaining a high etch rate (at least 4000 A/min).

Figure 4A:
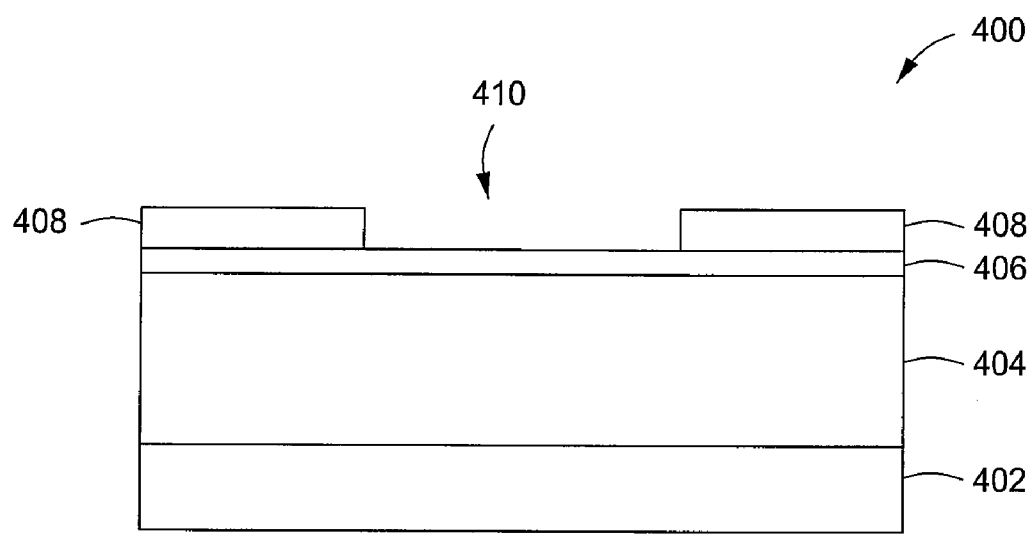
FIG. 4A is a schematic diagram of a substrate having a tri-layer resist in accordance with some embodiments of the present invention.
Figure 4B:
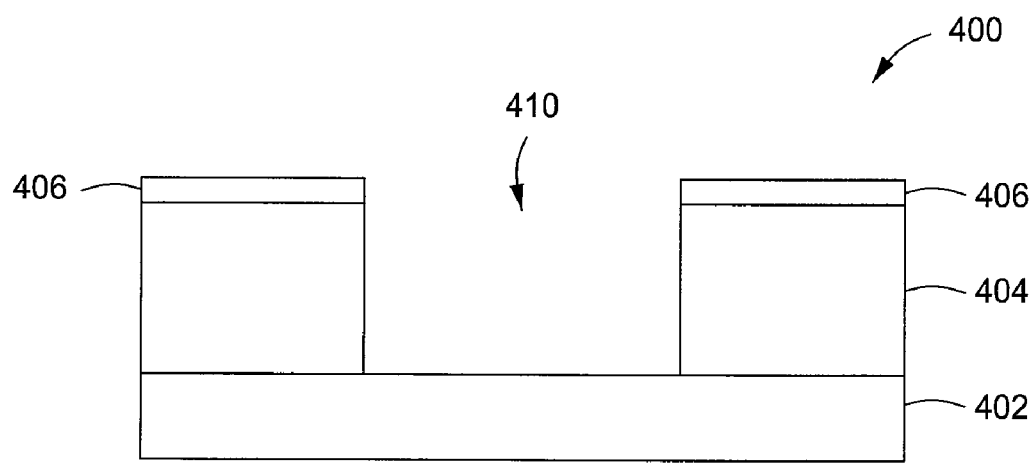
FIG. 4B is a schematic diagram of a resulting etch of the substrate of FIG. 4A in accordance with some embodiments of the present invention.

The above-described methods may be used to advantage in many processes for etching organic, low-k dielectric materials. For example, FIGS. 4A-B depict one non-limiting example of stages of etching a substrate having a tri-layer resist formed thereon in accordance with some embodiments of the present invention. As shown in FIG. 4A, a substrate 400 may comprise a base layer 402 having a tri-layer resist 404 formed thereon. In a non-limiting example, the tri-layer resist 404 may comprise an amorphous carbon layer (such as Advanced Patterning Film, available from Applied Materials, Inc. of Santa Clara, Calif.), a spin-on bottom anti-reflective coating (BARC), and a I-line resist layer. A cap layer 406 (similar to cap layer 206 described above with respect to FIGS. 2A-B) may be provided over the tri-layer resist 404 and is patterned with resist 408 to form an opening 410 corresponding to one or more features to be etched into the tri-layer resist 404.

Using the patterned resist layer 408 as a mask, the tri-layer resist 404 may be etched to extend the opening 410 into the layers of the tri-layer resist 404, as depicted in FIG. 4B, in accordance with any of the etching embodiments disclosed herein. Each of the layers of the tri-layer resist 404 can be etched using a similar chemistry and process parameters. As discussed above with respect to FIGS. 2A-B, the resist layer 408 may be partially or completely consumed during the etch process, as shown in FIG. 4B.

To etch the tri-layer resist 404, a process gas may be supplied to an etch reactor having the substrate 400 disposed therein. The process gas may comprise an oxygen containing gas, such as oxygen ($O_2$), a nitrogen-containing gas, such as nitrogen ($N_2$), and methane ($CH_4$). Optionally, the process gas may further comprise a carrier or dilutant gas, such as argon (Ar) or carbon monoxide (CO).

The process gas may be supplied to the etch reactor at a total gas flow of from about 100-1000 sccm. In some embodiments, the total gas flow is from about 100-1000 sccm, and in one embodiment the total gas flow is about 550 sccm. The process gas may utilize a range of compositions. In some embodiments, the process gas may comprise between about 9-20 percent of an oxygen-containing gas (i.e., an oxygen-containing gas flow of between about 20-100 sccm). In some embodiments, the process gas may comprise between about 10-30 percent $CH_4$ (i.e., a $CH_4$ gas flow of between about 50-200 sccm). Optionally, in some embodiments, the process gas may comprise between about 50-80 percent of the nitrogen-containing gas (i.e., a nitrogen-containing gas flow of between about 50-400 sccm). In one specific embodiment, $CH_4$ is provided at a flow rate of about 100 sccm, $N_2$ is provided at a flow rate of about 400 sccm, and $O_2$ is provided at a flow rate of about 50 sccm.

A plasma is formed from the process gas to etch the tri-layer resist 404 through the opening 410 in the masking layer 406. In some embodiments, the plasma is a high density plasma, e.g., having a density greater than or equal to about $5 \times 10^{10}$ ions/cm$^3$. The plasma may be formed by coupling RF power to the process gas to dissociate and ionize the process gas. Generally, between about 200-1600 Watts of RF power may be provided at a frequency of between about 1-30 Mhz. In one embodiment, about 800 Watts of RF power is supplied at a frequency of about 13.56 Mhz.

The temperature and pressure of the etch reactor are regulated during processing to maintain an environment suitable for etching the tri-layer resist 404. The temperature may be controlled in a range of between about 0-60 degrees Celsius. In one embodiment, the temperature is maintained at about 20 degrees Celsius. The pressure may be maintained in range of between about 5-500 mTorr. In one embodiment, the pressure is maintained at about 20 mTorr.

The plasma may be maintained until the etch process is complete (for example, as determined by elapsed time, optical endpoint detection techniques, monitoring of the plasma effluent, or the like), at which time the method ends and the substrate 400 may be further processed as desired. Optionally, the tri-layer resist 404 may be etched in a multi-step process as described above with respect to the method 300.

Thus, improved methods for etching organic materials have been provided herein. The inventive methods advantageously provide for improved sidewall profiles and critical dimensions at high etch rates. Although described above in certain specific embodiments, it is contemplated that organic materials may be etched using a plasma formed from the process gas in any suitable manner. For example, the plasma may be formed by applying RF signals having other frequencies, applying multiple RF signals, or the like, or through the use of remote plasma generators, or the like.

While the foregoing is directed to embodiments of the present invention, other and further embodiments of the invention may be devised without departing from the basic scope thereof, and the scope thereof is determined by the claims that follow.

The invention claimed is:

1. A method of etching organic low-k dielectric materials, comprising:
   placing a substrate comprising an exposed organic low-k dielectric material in an etch reactor, wherein the organic low-k dielectric material comprises at least one of a polymer-based low-k dielectric material or an organic polymer;
   supplying a process gas comprising about 5-30 percent of an oxygen-containing gas, about 50-80 percent of a nitrogen-containing gas, and about 10-30 percent of methane ($CH_4$); and
   forming a plasma from the process gas to etch the organic low-k dielectric material.

2. The method of claim 1, wherein the organic low-k dielectric material further comprises at least one of a bottom anti-reflective coating or one or more layers of a tri-layer resist.

3. The method of claim 1, wherein the oxygen-containing gas is $O_2$ and the nitrogen-containing gas is $N_2$.

4. The method of claim 1, wherein $CH_4$ is provided at a rate of between about 50-200 sccm.

5. The method of claim 1, wherein $N_2$ is provided at a rate of between about 50-400 sccm.

6. The method of claim 1, wherein $O_2$ is provided at a rate of between about 20-100 sccm.

7. The method of claim 1, wherein the process gas consists essentially of an oxygen-containing gas, a nitrogen-containing gas, and methane.

8. The method of claim 7, wherein the oxygen-containing gas is $O_2$ and the nitrogen-containing gas is $N_2$.

9. The method of claim 1, wherein the etch reactor is maintained at temperature of between about 0-50 degrees Celsius.

10. The method of claim 1, further comprising:
    maintaining the etch reactor at a pressure in a range of between about 5-500 mTorr.

11. The method of claim 1, wherein the step of forming a plasma further comprises:
    supplying between about 200-1600 Watts of RF power at a frequency of between about 1-30 MHz.

12. The method of claim 1, wherein the step of forming a plasma further comprises:
    forming a plasma having a density of greater than or equal to about $5\times10^{10}$ ions/cm$^3$.

13. The method of claim 1, further comprising:
    etching the organic layer at an etch rate of between about 3000-5500 Å/min.

14. A method of etching organic low-k dielectric materials, comprising:
    placing a substrate comprising an exposed organic low-k dielectric material in an etch reactor;
    forming a plasma from a process gas comprising an oxygen-containing gas and a nitrogen-containing gas to etch the organic low-k dielectric material for a first period of time; and
    forming a plasma from a process gas comprising an oxygen-containing gas, a nitrogen-containing gas, and methane ($CH_4$) to etch the organic low-k dielectric material for a second period of time.

15. The method of claim 14, wherein the nitrogen-containing gas is $N_2$ and is provided at a rate of between about 50-400 sccm during each of the etch periods, and wherein the oxygen-containing gas is $O_2$ and is provided at a rate of between about 20-100 sccm during each of the etch periods.

16. The method of claim 15, wherein $CH_4$ is provided at a rate of between about 50-200 sccm.

17. The method of claim 14, wherein the process gas comprising an oxygen-containing gas, a nitrogen-containing gas, and methane ($CH_4$) further comprises:
    about 10-30 percent methane ($CH_4$), about 50-80 percent $N_2$, and about 5-30 percent $O_2$.

18. A method of etching organic low-k dielectric materials, comprising:
    placing a substrate comprising an exposed organic low-k dielectric material in an etch reactor;
    supplying a process gas consisting essentially of about 5-30 percent of an oxygen-containing gas, about 50-80 percent of a nitrogen-containing gas, about 10-30 percent methane ($CH_4$), and optionally a dilutant gas; and
    forming a plasma from the process gas to etch the organic low-k dielectric material.

19. The method of claim 18, wherein the dilutant gas comprises one of argon or carbon monoxide.

* * * * *